(12) United States Patent
Tallam et al.

(10) Patent No.: US 9,374,021 B2
(45) Date of Patent: Jun. 21, 2016

(54) PWM OUTPUT VOLTAGE MEASUREMENT APPARATUS AND METHOD

(71) Applicants: Rangarajan Tallam, Germantown, WI (US); Doyle F. Busse, Muskego, WI (US); Brian P. Brown, Mayville, WI (US); Russel J. Kerkman, Milwaukee, WI (US)

(72) Inventors: Rangarajan Tallam, Germantown, WI (US); Doyle F. Busse, Muskego, WI (US); Brian P. Brown, Mayville, WI (US); Russel J. Kerkman, Milwaukee, WI (US)

(73) Assignee: Rockwell Automation Technologies, Inc., Mayfield Height, OH (US)

( * ) Notice: Subject to any disclaimer, the term of this patent is extended or adjusted under 35 U.S.C. 154(b) by 261 days.

(21) Appl. No.: 14/107,026

(22) Filed: Dec. 16, 2013

(65) Prior Publication Data

US 2015/0171772 A1     Jun. 18, 2015

(51) Int. Cl.
*H02M 7/5387*     (2007.01)
*G01R 19/00*     (2006.01)
*G01R 31/34*     (2006.01)
*H02P 21/00*     (2016.01)

(52) U.S. Cl.
CPC ....... *H02M 7/53871* (2013.01); *G01R 19/0007* (2013.01); *G01R 31/343* (2013.01); *H02P 21/00* (2013.01)

(58) Field of Classification Search
CPC .................... H02M 7/53871; H02M 7/53875; H02M 2001/385; G01R 19/0007; G01R 31/343; H02P 27/08; H02P 6/18; H02P 6/182; H02P 6/085

USPC .......... 324/76.11, 76.12, 76.13, 76.15, 76.24, 324/76.28, 76.29, 76.31, 76.38, 76.42, 324/76.44, 76.58, 76.68, 118, 710; 363/13, 363/15, 16, 40, 41, 95, 98, 109, 120, 131, 363/135

See application file for complete search history.

(56) References Cited

U.S. PATENT DOCUMENTS

| | | | | |
|---|---|---|---|---|
| 3,967,173 A | | 6/1976 | Stich | |
| 4,597,037 A | | 6/1986 | Okado | |
| 4,888,533 A | * | 12/1989 | Gotoh | H02P 6/085 318/524 |
| 4,978,895 A | * | 12/1990 | Schwarz | H02P 6/18 318/400.04 |
| 5,198,733 A | * | 3/1993 | Wright | H02P 6/22 318/400.34 |
| 5,450,306 A | * | 9/1995 | Garces | H02M 5/458 363/132 |

(Continued)

OTHER PUBLICATIONS

Mancini, "Op Amp Stability and Input Capacitance", Analog and Mixed-Signal Products, Analog Applications Journal, 1Q 2004, pp. 24-28.

(Continued)

*Primary Examiner* — Arleen M Vazquez
*Assistant Examiner* — Lee Rodak
(74) *Attorney, Agent, or Firm* — Fay Sharpe LLP

(57) ABSTRACT

Output voltage feedback systems and methods are provided for controlling voltage source inverter output voltages using low bandwidth buffer circuitry and low A/D converter sample rates to sense and sample PWM output voltage waveforms to provide an estimated volt-second value for phase voltage or line-line voltage as feedback for controlling the voltage source inverter.

10 Claims, 6 Drawing Sheets

(56) References Cited

U.S. PATENT DOCUMENTS

| | | |
|---|---|---|
| 5,552,977 A | 9/1996 | Xu et al. |
| 5,581,452 A | 12/1996 | Yamamoto |
| 5,600,548 A | 2/1997 | Nguyen et al. |
| 5,640,073 A * | 6/1997 | Ikeda .................. H02P 6/085 318/400.03 |
| 5,850,132 A | 12/1998 | Garces |
| 5,867,380 A | 2/1999 | Lee |
| 6,128,436 A * | 10/2000 | Bos ...................... H02P 6/18 388/815 |
| 6,952,089 B2 | 10/2005 | Matsuo |
| 7,102,327 B2 | 9/2006 | Ho |
| 2008/0297079 A1 * | 12/2008 | Kanamori ............... H02P 6/18 318/400.06 |
| 2013/0278189 A1 | 10/2013 | Yamaguchi et al. |

OTHER PUBLICATIONS

Bhat, "Measure the Input Capacitance of an Op Amp", Application Note 5086: http://www.maximintegrated.com/an5086, Maxim Integrated Products, Jul. 1, 2011, pp. 1-6.

"Precision Switched Integrator Transimpedance Amplifier", IVC102, Burr-Brown Corporation, Jun. 1996, 14 pgs.

Yasuhiro et al., "Digital Control of PWM Inverter Using Ultra High Speed Network for Feedback Signals Based on Rocket I/O Protocol", 2013 1$^{st}$ Int'l Future Energy Electronics Conference (IFEEC), IEEE, Nov. 3, 2013, pp. 728-733.

European Search Report, EP Appl. No. 14197932.8-1560/2887084, Mailed May 28, 2015, Completed May 18, 2015, Munich, DE, 6pgs.

\* cited by examiner

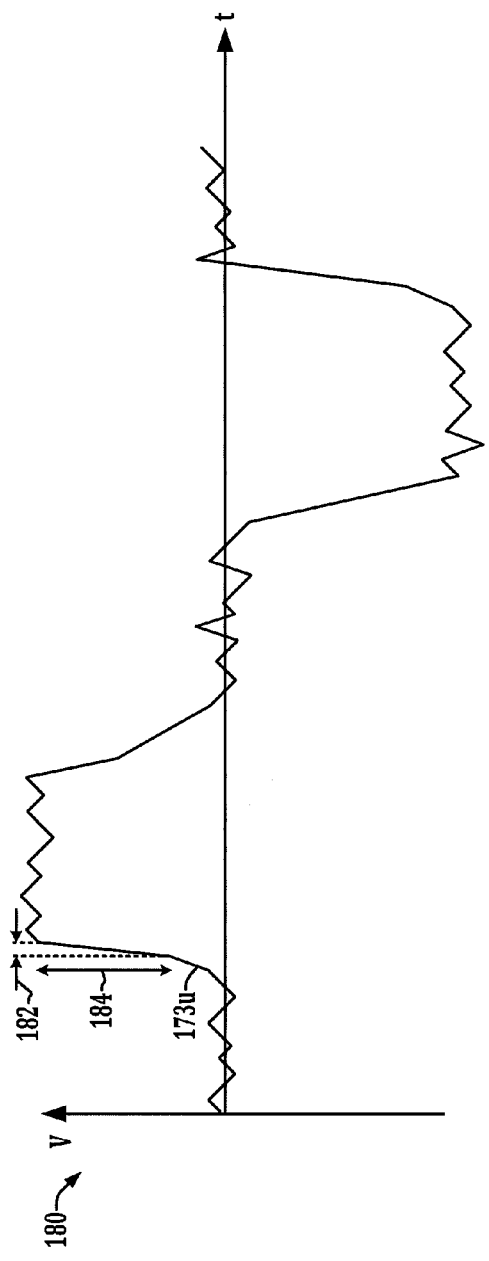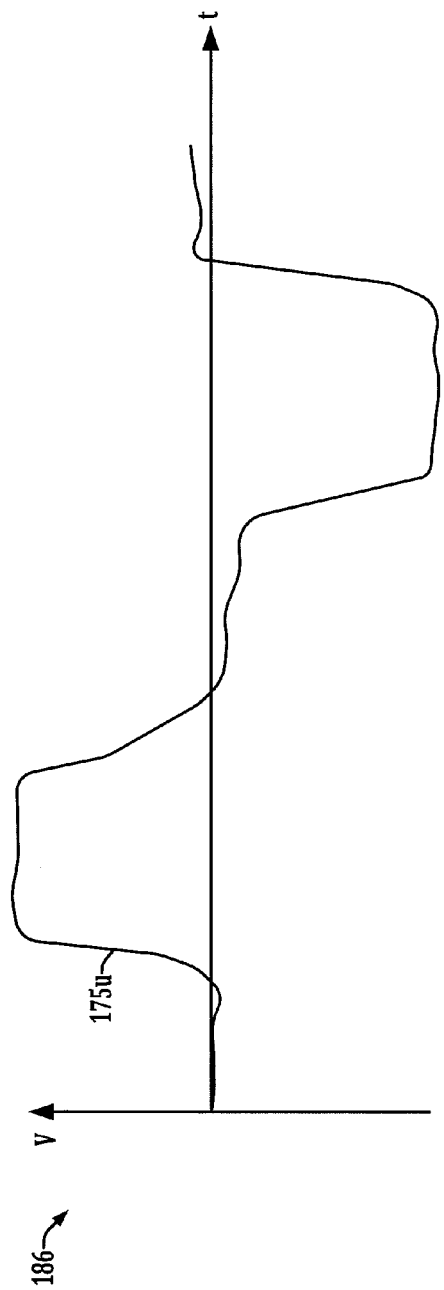

US 9,374,021 B2

PWM OUTPUT VOLTAGE MEASUREMENT APPARATUS AND METHOD

BACKGROUND

Motor drives and other switching power supplies are used to provide the multiphase AC output power to drive a load, such as an induction motor. Most conventional AC drives include a switching inverter output stage which converts power from a DC bus to provide AC output voltages to drive the load using an array of switches individually connected between a corresponding terminal of the DC bus and one of the output terminals. Pulse width modulation type switching control is employed to selectively actuate the inverter switches in order to create variable frequency, variable amplitude output voltage signals at the individual load terminals. Switching operation is typically controlled in closed-loop fashion according to one or more setpoint signals or values and also according to feedback from the inverter output. In a typical case, a motor drive receives a speed or position setpoint, and may also receive a torque setpoint, together with feedback signals indicating the measured output voltage of the inverter and other operating conditions of the drive. One or more internal control loops are used to regulate output load motor speed, torque, voltage and/or current based on the received setpoints and feedback values.

Due to the pulse width modulated operation of the output inverter, however, accurate assessment of the voltage waveforms at the inverter output is difficult. Specifically, operation of the inverter switches at relatively high pulse width modulation frequencies, such as several kilohertz, causes the output voltage waveforms to include high frequency components. In addition, switching power supplies are noisy electrical environments, and the voltage output waveforms are thus not pure sinusoids. In many applications, moreover, the output rating of the driven load is relatively high, whereby the DC bus voltage and the AC output voltages are of relatively high values. Obtaining accurate feedback in these situations is therefore difficult, since the sensed signals are sometimes of very high voltage amplitudes, and the switching of large currents within the inverter creates a noisy environment in which it is difficult to accurately sense the output voltage signals. At the same time, however, high bandwidth sensing circuitry is required to be able to accurately reproduce the PWM voltage output waveforms for feedback purposes, and high-bandwidth sensing circuitry is more susceptible to noise. At very low modulation index operating levels, moreover, voltage waveform pulse widths are very narrow, and reflected wave effects as well as deadtime compensation effects become more significant, leading to increased difficulty in determination of the feedback signals. Accordingly, a need remains for improved methods and apparatus for sensing output voltages for control of switching inverters in motor drives and other power conversion applications.

SUMMARY

One or more aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter.

The present disclosure provides apparatus and techniques for measuring inverter output voltages by which the above another shortcomings can be mitigated or overcome, and by which feedback system component cost can be reduced without sacrificing the ability to accurately control the AC voltages provided to the load, including low modulation index operating points. Rather than attempting to accurately reproduce the PWM voltage waveform provided at the output of a switching inverter, including all the non-idealities and high-frequency components, the inventors have appreciated that improved control and noise immunity can be facilitated using low bandwidth sensing circuitry to measure or estimate the voltage-seconds or PWM cycle-averaged voltage of the output for use in feedback control of the inverter switching operation. Accordingly, reduced sampling frequencies can be used, and the analog input signal can be low pass filtered while using lower cost low bandwidth analog op amps and circuit components. Moreover, slew rate requirements become less stringent as the feedback signal can be scaled using high impedance divider circuits, thereby facilitating cost reduction.

In accordance with one or more aspects of the present disclosure, a feedback system is provided, including a low pass filter circuit with a cutoff frequency lower than that required to accurately quantify all the high frequency components of the PWM voltage signal being sensed, as well as a converter circuit to sample signals from the low pass filter and a processor that estimates a voltage-second value for a phase or line-line voltage of interest. In certain implementations, the sampled values are averaged over a PWM period to compute the estimated volt-second value, such as by accumulating sampled values and dividing an accumulation total by the number of samples in a corresponding PWM cycle. In certain embodiments, moreover, the processor refrains from accumulating sampled values falling within a tolerance range near zero volts thereby improving the accuracy of the voltage-seconds estimate.

Further aspects of the disclosure provide methods for estimating PWM inverter output voltages, including low pass filtering output voltage signals using low pass filters with a cutoff frequency below an output voltage waveform frequency that corresponds to a maximum rise or fall rate of the output voltage waveforms, as well as individually buffering the low pass filtered output voltage signals using analog buffer circuitry. The methods further involve sampling the buffered signals and determining an estimated volt-second value for a phase or line-line voltage of interest according to at least some of the sampled values.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which:

FIG. 4 is a graph showing an exemplary sensed PWM output voltage signal having high-frequency components and other non-idealities showing a maximum rise rate;

FIG. 5 is a graph illustrating an exemplary filtered output voltage signal obtained using the low pass filters in FIGS. 2 and 3;

DETAILED DESCRIPTION

Figure 1:
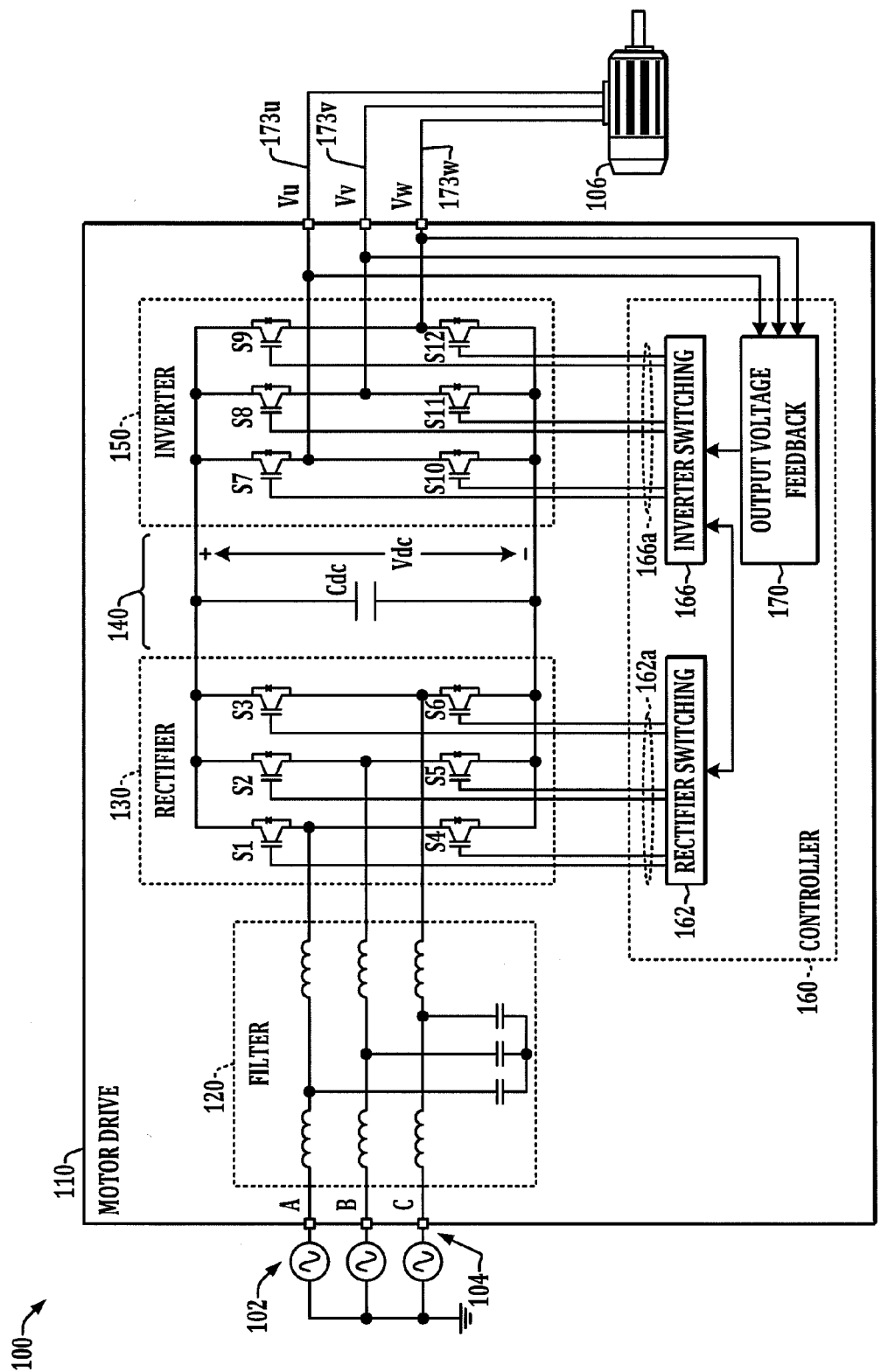
FIG. 1 is a schematic diagram illustrating an exemplary motor drive power conversion system with an output voltage feedback system according to one or more aspects of the present disclosure.

Referring now to the figures, several embodiments or implementations are hereinafter described in connection with the drawings, wherein like reference numerals are used to refer to like elements throughout, and wherein the various features are not necessarily drawn to scale.

A motor drive 110 is illustrated in FIG. 1, which receives three-phase electrical input power from a power source 102 via input terminals 104 connected to an LCL input filter 120. The drive 110 includes an active front end (AFE) rectifier 130 having switching devices S1-S6 operated according to switching control signals 162a from a rectifier switching control component 162 of a motor drive controller 160 to convert AC input power from phases A, B and C to provide a DC bus voltage Vdc across a capacitor Cdc of an intermediate DC bus circuit 140. The DC bus voltage is provided as an input to a voltage source inverter 150 (VSI) having switching devices S7-S12 operated according to inverter switching control signals 166a from an inverter switching component 166 of the controller 160 to create variable frequency, variable amplitude AC output signals at phase lines U, V and W to drive a motor load 106.

The drive further includes an output voltage feedback system 170 to provide feedback signals or values to one or more processors of the controller 160 for controlling the operation of the output inverter 150. The controller 160 is implemented using analog circuitry as well as one or more processors and associated memory provided with programming instructions to implement the rectifier and inverter switching control functions according to known pulse width modulation switching control principles. In addition, the output voltage feedback system 170 of the controller 160 receives analog output voltage feedback signals Vu, Vv and Vw from the output terminals 173u, 173v and 173w of the inverter 150 as well as various other voltage and/or current feedback signals or values from sensors in the motor drive 110 (not shown). The controller 160 uses the feedback signals or values, including those representing the output voltages for various motor control functions in operating the active front and rectifier 130 and/or the inverter 150 for driving the motor load 106 according to a desired speed, torque and/or other setpoint values and/or for operating the drive 110 during regenerative conditions.

Figure 2:
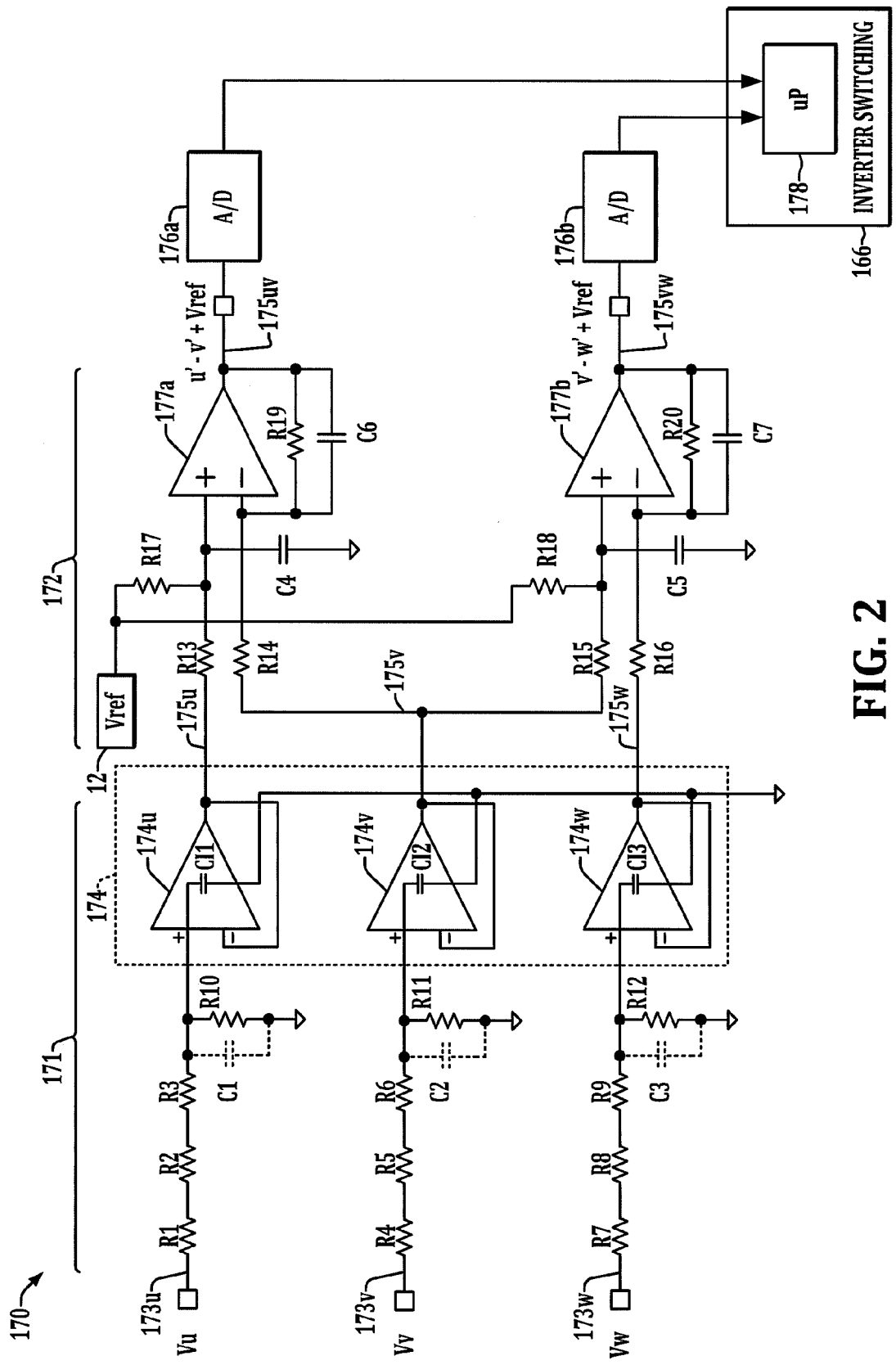
FIG. 2 is a schematic diagram illustrating further details of an exemplary output voltage feedback system embodiment having an initial low pass filter stage and a second stage to produce buffered line-line voltage signals preceding analogto-digital converters in the motor drive of FIG. 1 in accordance with the present disclosure.

FIG. 2 illustrates one embodiment of the output voltage feedback system 170, which includes a three-phase first stage 171 with individual low pass filter circuits formed by a series of resistors and a capacitance, wherein the resistors in this embodiment also provide a voltage divider circuit. With respect to the first phase "U", for example, a resistor voltage divider is formed by resistors R1, R2, R3 and R10, where the node joining resistors R3 and R10 provides a non-inverting input to a first voltage follower op amp circuit 174u which buffers the corresponding line voltage signal and provides a corresponding buffered output 175u from the first stage 171. Similarly, the output voltage signal 173v for the phase voltage Vv is provided through a resistive divider circuit including resistors R4, R5, R6 and R11 to provide a non-inverting input to an associated voltage follower op amp circuit 174v, and the output voltage signal 173w for the phase voltage Vw is provided through a divider circuit formed by resistors R7, R8, R9 and R12 to provide a non-inverting input to a voltage follower op amp 174w as seen in FIG. 2. The input signals 173 may be any suitable inverter output voltage measurement, including without limitation line-neutral voltages, line-ground voltages, etc. The first circuit stage 171 provides an analog RC low pass filter via the voltage divider resistors and an input capacitance for each inverter output phase, in which the low pass filter capacitance is provided by a parasitic input capacitance CI1-CI3 of the associated amp 174u, 174v or 174w, alone or in combination with an optional external capacitance C1-C3.

Referring also to FIG. 4, the individual low pass filter circuits, moreover, have a cutoff frequency $f_{cutoff}$ which is less than an output voltage waveform frequency $f_{wf}$ that corresponds to a maximum rise or fall rate of an output voltage waveform of the output voltage signal 173. The graph 180 in FIG. 4 illustrates an exemplary inverter output waveform 173u from the first inverter output phase "U", which is a pulse width modulated voltage signal having a waveform including high-frequency components and various non-idealities due to the switching operation of the inverter switches S7-S12. As seen in FIG. 4, moreover, the voltage signal 173u has a maximum rise or fall rate determined as a ratio of the maximum waveform slope 184 divided by the corresponding rise time 182. Similar computation can be used to assess a maximum fall rate for downward slopes. In one example for a pulse width modulation switching frequency of several kilohertz, the PWM output voltage waveforms of the signals 173 have a waveform frequency $f_{wf}$ of 5 MHz-10 MHz. The inventors have appreciated that high bandwidth analog circuitry and high converter sample rates are required to accurately reproduce or quantify the waveforms having such high-frequency components. At the same time, however, high bandwidth sensing circuitry is particularly susceptible to noise typically found in motor drives and other switching power supplies. Consequently, conventional approaches that attempt to accurately reproduce all the non-idealities and high-frequency content of the inverter output frequency waveforms 173 suffer from poor performance, particularly for low modulation index operation where compensation based on the polarity of output currents is affected at low current magnitudes and near zero crossings of the current waveform, and reflected wave effects become more significant.

Referring also to FIG. 5, the low pass filter cutoff frequency $f_{cutoff}$ of the first feedback circuit stage 171 in FIG. 2 is advantageously set at a value below the waveform frequency $f_{wf}$. In order to maintain controllability of the motor drive, moreover, the inventors have further appreciated that determination of a volt-second value which is equivalent to that of the actual PWM output voltage waveform 173 can provide suitable feedback for close loop operation of the inverter 150 by the controller 160. The voltage follower op amp circuits 174 in FIG. 2 provide corresponding low pass filtered output voltage signals 175u, 175v and 175w to a second circuit stage. The graph 186 in FIG. 5 illustrates an exemplary filtered output voltage signal 175u provided by the follower op amp 174u, showing that the high-frequency components of the original signal 173u have been largely smoothed via the low pass filtering using a cutoff frequency $f_{cutoff}$ less than the waveform frequency $f_{wf}$. In certain embodiments, the cutoff frequency $f_{cutoff}$ of the analog low pass filter in the first stage 171 is about 1 MHz or less, preferably about 700 kHz or less, more preferably about 500 kHz or less, with one particular embodiment providing a low pass cutoff frequency $f_{cutoff}$ of about 600 kHz-700 kHz.

The analog low pass filtering of the output voltage waveform signals 173 thus advantageously reduces the susceptibility of the feedback circuit 170 to noise, and also facilitates reduction and component cost in the analog circuitry. For example, the first stage op amps 174 in certain implementations have individual bandwidths below the output voltage waveform frequency $f_{wf}$. In addition, the RC low pass filter frequency can be set in certain implementations without provision of an external capacitor, wherein the cutoff frequency $f_{cutoff}$ can be set by adjustment of the values of the resistive voltage divider circuitry (e.g., R1-R3 and R10) according to the parasitic capacitance of the associated op amp 174 (e.g., CI1 of the op amp 174u for the first phase "U"). In this regard, the feedback circuit input bandwidth, and hence the cutoff frequency of the low pass filtering provided by the first stage 171 can be tailored for a given application by adjustment of the resistive voltage divider circuitry resistance value(s) and/or by the bandwidth of the chosen for stage op amps 174.

Figure 3:
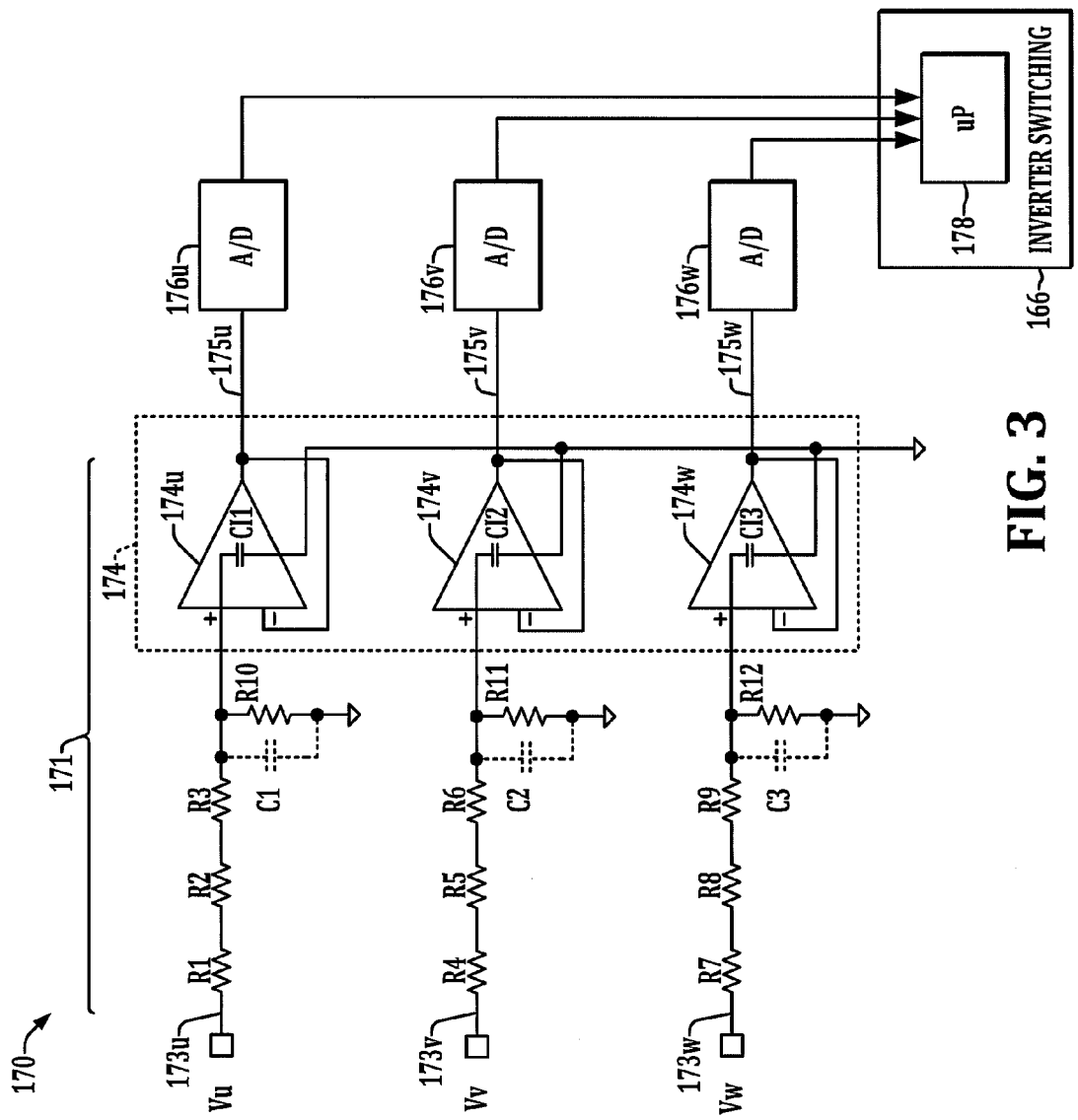
FIG. 3 is a schematic diagram illustrating another voltage feedback system embodiment in which line-neutral or line-ground filtered signals are sampled in the motor drive of FIG. 1.

In addition, as seen in FIGS. 2 and 3, use of the internal capacitance CI of the voltage follower op amp circuits 174u-174w, in whole or in part, to set the low pass filter cutoff frequency $f_{cutoff}$, advantageously facilitates matching of the low pass filter capacitances, particularly where the op amps 174u-174w are integrated into a single integrated circuit package 174, as shown in dashed line in FIGS. 2 and 3. In this manner, circuit component matching facilitates reduction in common mode noise issues within the feedback circuit 170, and also facilitates uniformity in the cutoff frequencies $f_{cutoff}$ of the individual low pass filter circuits provided in the first circuit stage 171. In practice, the use of fairly high voltage divider resistance values (e.g., 2 Mohms) for cut off frequencies less than 1 MHz means that a relatively small amount of capacitance is required to set the low pass filter cutoff frequency. In this regard, the parasitic input capacitance of the first stage op amps 174 may be in the range of a few picofarads or tens of picofarads (including parasitic capacitance is associated with connection to integrated circuit pins and associated circuit board trace routing), and the parasitic input capacitance may thus be suitable for defining the desired low pass filtering cutoff frequency $f_{cutoff}$. Alternatively, as shown in FIGS. 2 and 3, an external capacitance (e.g., C1-C3, shown in dashed line in the figures) can be connected from the non-inverting input of the first stage op amp 174 to a circuit ground in order to set the low pass filter cutoff frequency $f_{cutoff}$, in combination with the parasitic input capacitance CI.

In the illustrated embodiments, moreover, the slew rate of the first stage op amps 174 is preferably sufficiently high (relative to the analog bandwidth frequency) to prevent distortion in the measured voltage:

$$\text{Slew Rate} \geq 2\pi f_{BW} V_{peak}$$

where $V_{peak}$ is the swing in the voltage applied to the first stage 171 (which is a very small voltage due to the voltage divider resistor network provided at the input of the first stage circuitry, e.g., +/-1 V ($V_{peak}$=1 v)) to mitigate distortion of the signals.

As further seen in FIG. 2, a second circuit stage 172 in this example provides an analog subtractor circuit with op amps 177a and 177b, each receiving two buffered signals 175 from the follower circuits 174 and providing a buffered line-line voltage signal output. In this example, for instance, the first subtractor circuit includes op amp 177a and summing resistors R13 and R14 through which the buffered signals 175u and 175v are received at non-inverting and inverting inputs of the op amp 177a, respectively. A feedback circuit including the parallel combination of R19 and C6 is formed between the op amp output and the inverting input, with a capacitor C4 connected between the non-inverting input and the circuit ground. In addition, the non-inverting input of the op amp 177a is connected to a reference voltage 12 (Vref) through a resistor R17. Thus connected, the first op amp circuit 177a provides a buffered output voltage representing the line-line voltage between the inverter output phases "U" and "V" plus an offset provided by the reference 12 (u'-v'+Vref). In this manner, where the op amp circuitry is powered by dual rail (bipolar) supplies, the offsetting via the reference 12 can be used to interface the buffered outputs 175uv with a converter circuit (A/D) 176a powered by a single rail supply. Other implementations are possible in which different offsetting (or no offsetting) is used in generating a line-line signal 175uv from two or more line-neutral or line-ground signals 175u, 175v and/or 175w). In the example of FIG. 2, moreover, a second subtractor circuit includes resistors R15, R16, R18 and R20 and capacitors C5 and C7 with a second op amp 177b to provide a buffered line-line voltage signal 175vw representing the voltage between phases "V" and "W" offset by the reference amount 12 based on the signals 175v and 175w.

A/D converters 176a and 176b receive and sample the buffered line-line voltage signals 175uv and 175vw from the analog subtractor circuit 172 at a sampling frequency $f_s$ which is above the low pass filter cut off frequency $f_{cutoff}$. The converters 176 provide a plurality of sampled values for each of the sampled line-line voltages to a microprocessor 178 of the inverter switching control component 166 for further processing and closed loop control operation to control the inverter 150. In particular, the processor 178 in this example is programmed to determine an estimated volt-second value for one or more line-line voltages of interest according to at least some of the sampled values from the converters 176 to facilitate output voltage feedback for control of the switching inverter 150. In this regard, the line-line voltage between phases "W" and "U" can be derived by the processor 178 based on the received sampled values associated with the other two line-line voltages, or a third op amp circuit 177 can be provided with an associated A/D converter 176 to provide sampled values of the third line-line voltage to the processor 178.

FIG. 3 illustrates an alternate embodiment having a first stage analog circuit 171 as described above in connection with FIG. 2, where three A/D converters 176u, 176v and 176w are provided to individually sample and convert the line-neutral or line-ground buffered, filtered, signals 175u, 175b and 175w, respectively, and to provide the corresponding sampled values to the processor 178. With these, the controller 160 can determine any desired line-line voltages.

The low pass filtering of the sensed inverter output voltage signals 173 thus facilitates noise immunity, while still allowing for closed loop feedback control of the inverter operation. In this regard, the disclosed techniques do not reproduce the actual pulse width modulated output voltage waveforms in digital form, but instead produce an estimate of a lower frequency waveform having an equivalent volt-second value, which can then be used for feedback by the controller 162 operate the motor drive 110. This approach does not require a high-bandwidth op amp 174, 177 or other high-bandwidth circuitry. Moreover, the disclosed technique advantageously facilitates use of a lower sampling frequency by the converters 176 compared with conventional approaches. In order to facilitate accurate reproduction of the filtered signals 175, the sample rates for the converters 176 is preferably set at least twice the low pass filter cut off frequency ($f_s \geq 2f_{cutoff}$), and the converter sample rate is preferably at least 10-20 times the low pass filter cutoff frequency to mitigate aliasing problems ($f_s \geq 10f_{cutoff}$). In one possible implementation, for instance, a sample frequency of 10-20 MHz can be used in combination with a low pass filter cutoff frequency of about 1 MHz or less.

Figure 6:
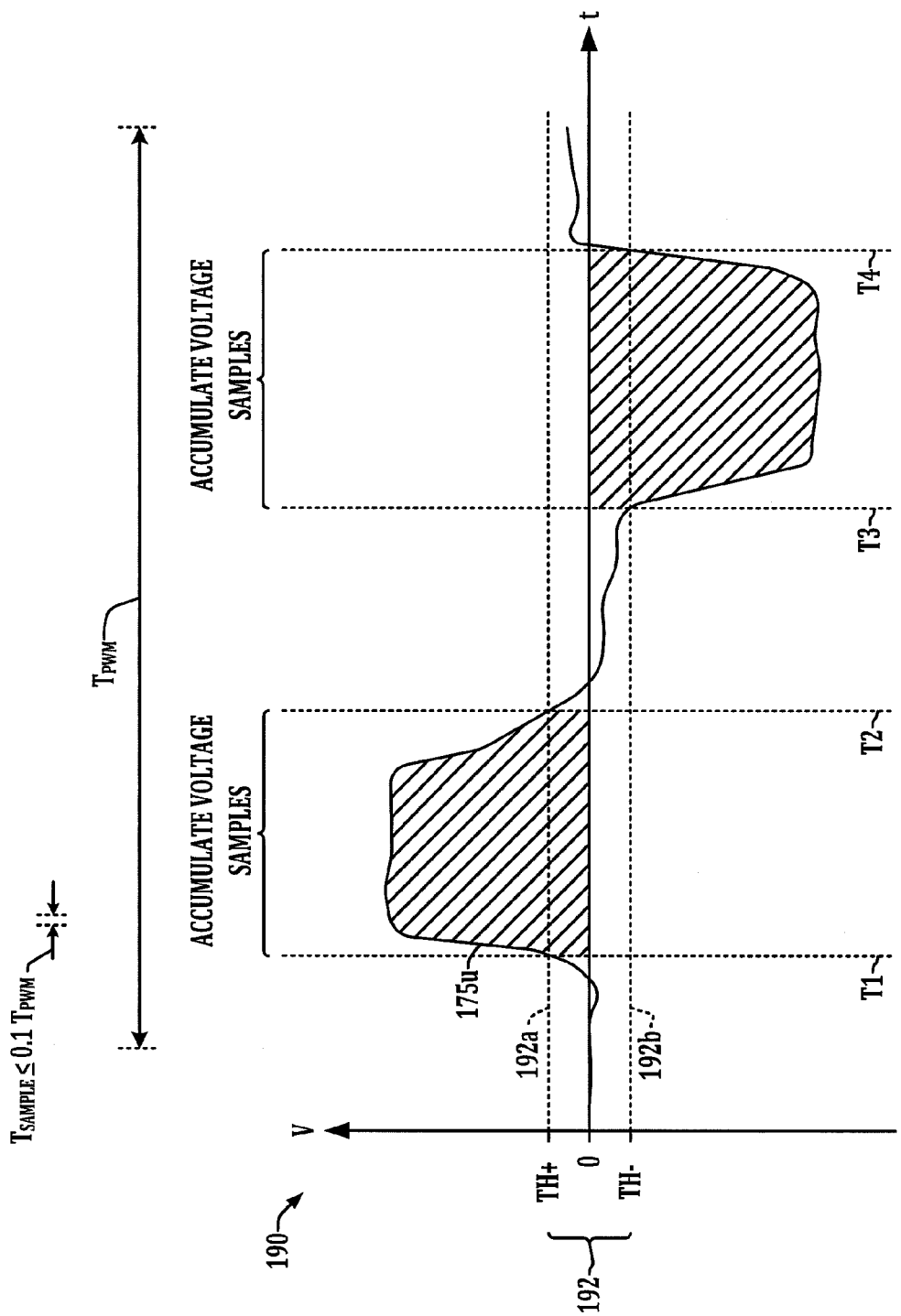
FIG. 6 is a graph illustrating the filtered output voltage signal with selective accumulation of voltage samples when the output voltage signal is outside of a predefined tolerance range.

Referring also to FIG. 6, a graph 190 illustrates the filtered waveform 175u corresponding to the output voltage of phase "U" of the inverter output over a pulse width modulation cycle or period $T_{PWM}$. In operation, the processor 178 is programmed to determine an estimated volt-second value for a phase voltage of interest (e.g., using the circuitry of FIG. 3) or for a line-line voltage of interest (e.g., using the circuitry of FIG. 2 or FIG. 3) according to at least some of the sampled values from the converters 176 for output voltage feedback to control the switching inverter 150. In one possible implementation, the processor 176 averages some or all of the sampled values from the converter(s) 176 corresponding to the phase voltage or line-line voltage of interest over a pulse width modulation period $T_{PWM}$ (e.g., averages the absolute values of the sampled values) to compute the estimated volt-second value. As previously mentioned, rather than high-bandwidth analog signal processing and high-speed sampling for reproducing the original output voltage pulse width modulated waveform having all the non-idealities and high-frequency components, the present disclosure allows slowing the feedback system down to a frequency range of interest, and the use of the resulting volt-second estimates for feedback control to facilitate cost reduction and improved noise immunity without significantly sacrificing feedback control accuracy. In one possible example, the sample frequency $f_s$ of the A/D converters 176 is about 10 times the pulse width modulation frequency or more (the sampling period $T_{SAMPLE} \leq 0.1 T_{PWM}$), and the processor 178 accumulates at least some of the sampled values over the pulse width modulation period to provide an accumulation total value (e.g., for at least one line-line or line-neutral or line-ground voltage value of interest), and divides the accumulation total by the number of samples in the PWM period in order to provide the estimated volt-second value for the phase voltage(s) or line-line voltage(s) of interest. In this regard, the processor 178 advantageously accumulates the absolute values of the samples from the converters 176, although any suitable form of averaging can be used which facilitates estimating a volt-second voltage value.

In certain embodiments, moreover, the processor 178 refrains from accumulating sampled values that fall within a predefined range 192 as shown in FIG. 6. In this regard, the processor 178 can either refrain from adding a given sample value to the accumulation total if that value is determined to be within the range 192 and/or can simply add "0" to the total for that particular sample period. The range 192 can be any predefined range, and preferably includes values representing positive and negative voltage on either side of a value corresponding to 0 V. In the illustrated example, a positive threshold TH+ 192a is set to a value above that representing 0 V, and a negative threshold TH− 192b is sent below the zero value, but the range 192 need not be symmetric about the zero voltage level. This technique advantageously reduces the effect of noise and prevents DC offsets in the calculated volt-second or average voltage value over the PWM cycle. In the example of FIG. 6, the sampled values are accumulated during the time range from T1 through T2, but the processor 178 refrains from accumulating the samples from T2 through T3 since these values are within the range 192. Thereafter, the processor 178 accumulates the sampled values from T3 through T4, and then refrains from accumulating the samples after T4 as these are within the predefined range 192. In this regard, the inventors have appreciated that the line-line voltage of a typical voltage source inverter (VSI) has only certain discrete levels (e.g., two non-zero levels (+DC, −DC) for a two-level VSI), and hence sampled values falling within a properly defined threshold range 172 can be assumed to be zero, whereby refraining from accumulating such sampled values mitigates measurement noise effects on the calculated volt-second value.

Figure 7:
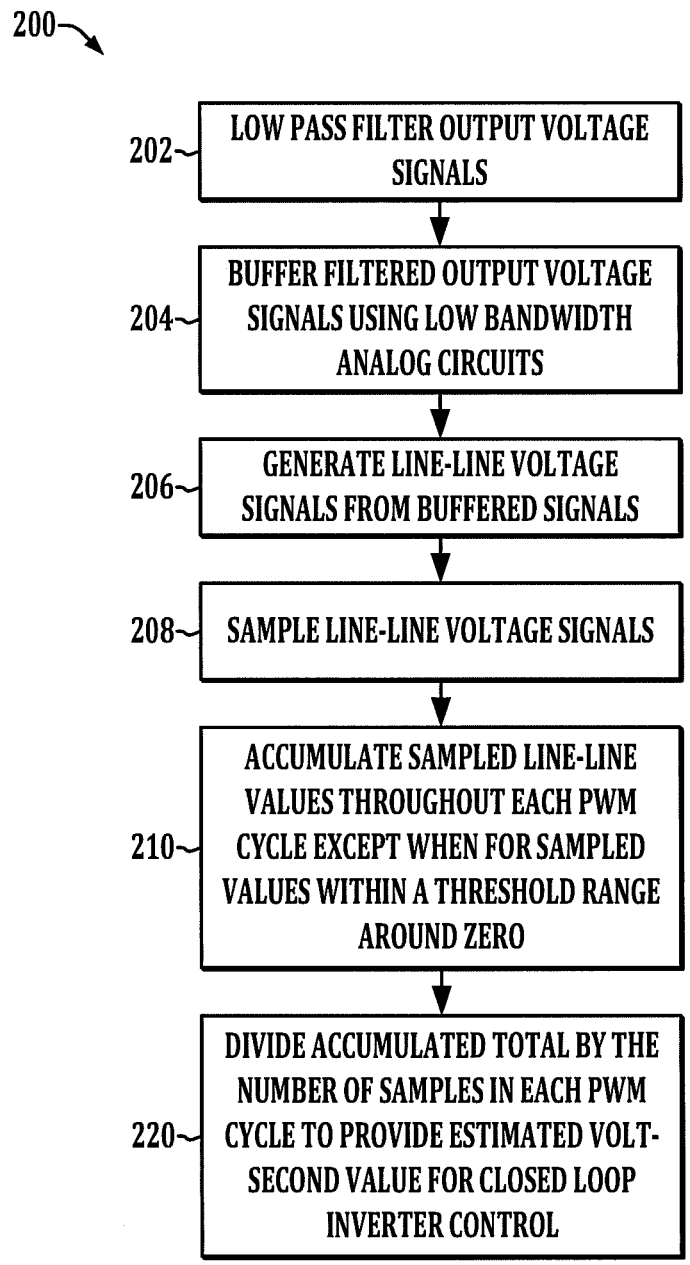
FIG. 7 is a flow diagram illustrating an exemplary method for estimating output voltages of a PWM switching inverter in accordance with further aspects of the present disclosure.

FIG. 7 illustrates a process or method 200 for estimating the output voltages of a PWM inverter (e.g., inverter 150 above). While the method 200 is illustrated and described as a series of acts or events, the methods of the present disclosure are not limited by the illustrated ordering of such acts or events except as specifically set forth herein. Except as specifically provided hereinafter, some acts or events may occur in different order and/or concurrently with other acts or events apart from those illustrated and described herein, and not all illustrated steps may be required to implement a process or method in accordance with the present disclosure. The illustrated methods may be implemented in hardware, processor-executed software or firmware, or combinations thereof, in order to provide inverter output voltage feedback and closed loop inverter control as described herein, and various embodiments or implementations include non-transitory computer readable mediums having computer-executable instructions for performing the illustrated and described methods. For example, the method 200 may be implemented by using analog circuitry and a processor 178 as described herein using program instructions for volt-second value computation, with various data being stored in an electronic memory associated with the processor 178, although the method 200 can be implemented in other systems, including without limitation those illustrated and described herein.

At 202 in FIG. 7, one or more output voltage signals are low pass filtered at a cutoff frequency below the output voltage waveform frequency that corresponds to the maximum rise or fall rate of the original output voltage waveforms, for example, using the first stage RC low pass filter circuitry 171 described above, and the filtered output voltage signals are buffered at 204 using low bandwidth analog circuits. For instance, the voltage follower op amp circuits 174 of FIGS. 2 and 3 can be used to buffer the filtered output voltage signals as described above. At 206 in FIG. 7, line-line voltage signals are optionally generated from the buffered signals, for example, using the second stage analog circuitry 172 illustrated and described above in connection with FIG. 2. This step may be omitted, for example, when using the circuitry in FIG. 3 above.

The line-line voltage signals (as shown in FIG. 2, or the line-neutral or line-ground signals in FIG. 3) are sampled at 208 at a sampling frequency above the low pass filter cut off frequencies to provide a plurality of sampled values. At 210, the sampled values are accumulated through each PWM cycle (e.g., accumulating the absolute values of the samples), optionally excluding accumulation of samples that fall within a threshold range around zero (e.g., threshold range 192 in FIG. 6 above). At 220 in FIG. 7, the accumulated total for the given PWM cycle is divided by the number of samples of that cycle in order to provide the estimated volt-second value for closed loop control of the inverter.

The above described techniques advantageously provide higher noise immunity feedback estimation of the output of the pulse width modulated inverter 150, thereby facilitating closed loop control of the motor drive 110, while also facilitating reduction in component costs. In addition, the estimation of the equivalent volt-second values corresponding to the original PWM output voltage waveforms can be done without the high sample rate converter architectures required by conventional approaches in which accurate reproduction of the high frequency content of the PWM waveform was attempted. In this regard, the conventional goal of achieving a high-bandwidth input stage prevented or inhibited the ability to use a high sense resistance, because the higher the sense resistance, the more significant the impact of the parasitic op amp input capacitance becomes with respect to low pass filtering. Thus, the new approach (reducing the bandwidth of the first stage) facilitates the use of higher sense resistance in the first stage. Moreover, the optional use of the internal parasitic capacitance of op amps 174 to set the low pass filter cutoff frequency avoids or mitigates the potential for variations in the capacitance of an external capacitor, particularly where the buffer op amps 174 are formed within a unitary integrated circuit package (e.g., as shown in FIGS. 2 and 3 above). For instance, external capacitors are typically of 1% or higher tolerance, whereas the internal parasitic capacitance of the op amp inputs is very predictable. In addition, the various concepts of the present disclosure find particular utility in motor drives and other high-noise switching power supply applications. For example, common mode noise is typically significant in motor drive applications in which providing all the first stage op amps 174 in a single integrated circuit package allows reliance upon the parasitic input capacitance, where the capacitance on the silicon is of very high tolerance (good capacitance component matching). Consequently, any common mode noise that is coming across the three output phases of the inverter 150 has a balanced impedance which cancels out the common mode noise (better than if external capacitors are used in the first stage 171). Thus, the design using the internal parasitic capacitors is less susceptible to common mode noise than conventional techniques. Moreover, the disclosed designs advantageously facilitate operation with little or no common mode noise effects by the use of internal parasitic capacitors in combination with precision resistors R1-R12, where precision resistors for these input circuits are readily obtained in higher tolerances that are available for capacitors. In this regard, 0.1% resistors may be obtained for the input circuitry R1-R12 at relatively low cost.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A method for estimating output voltages of a pulse width modulated inverter, the method comprising:
   individually low pass filtering a plurality of output voltage signals of a pulse width modulated inverter using a corresponding plurality of low pass filter circuits having low pass filter cut off frequencies lower than an output voltage waveform frequency corresponding to a maximum rise or fall rate of output voltage waveforms of the output voltage signals;
   individually buffering the low pass filtered output voltage signals using a corresponding plurality of analog buffer circuits to provide a plurality of buffered voltage signals;
   sampling at least some of the buffered voltage signals at a sampling frequency above the low pass filter cut off frequencies to provide a plurality of sampled values;
   averaging at least some of the sampled values corresponding to the phase voltage or line-line voltage of interest over a pulse width modulation period to compute the estimated volt-second value using the at least one processor, by:
      accumulating at least some of the sampled values corresponding to the phase voltage or line-line voltage of interest over the pulse width modulation period to provide an accumulation total value for the pulse width modulation period using the at least one processor, and
      refraining from accumulating sampled values that fall within a predefined range that includes values representing positive and negative voltages, and
      dividing the accumulation total value by a number of samples for the pulse width modulation period to provide the estimated volt-second value for the phase voltage or line-line voltage of interest using the at least one processor; and
   using at least one processor, determining an estimated volt-second value for a phase voltage or line-line voltage of interest according to at least some of the sampled values.

2. The method of claim 1, comprising:
   combining at least two of the buffered signals using an analog subtractor circuit to provide a buffered line-line voltage signal;
   sampling the buffered line-line voltage signal at the sampling frequency to provide the plurality of sampled values;
   accumulating at least some of the sampled values over the pulse width modulation period to provide the accumulation total value for the pulse width modulation period using the at least one processor; and
   dividing the accumulation total value by the number of samples for the pulse width modulation period to provide the estimated volt-second value using the at least one processor.

3. The method of claim 1, comprising, using the at least one processor, using the estimated volt-second value as an estimate of an actual PWM cycle-averaged voltage output of the inverter as feedback for closed loop control of the inverter.

4. A feedback system for providing output voltage feedback for controlling a switching inverter, comprising:
- a low pass filter circuit with a cutoff frequency below an output voltage waveform frequency corresponding to a maximum rise or fall rate of an output voltage waveform of the output voltage signal, the low pass filter circuit comprising:
  - an input receiving at least one output voltage signal from the switching inverter,
  - an RC low pass filter providing a low pass filtered output voltage signal, and
  - an analog voltage follower circuit receiving the low pass filtered output voltage signal and providing a buffered voltage signal;
- a converter circuit connected to sample the buffered voltage signal at a sampling frequency above the low pass filter cut off frequency and provide a plurality of sampled values; and
- at least one processor programmed to determine an estimated volt-second value for a phase voltage or line-line voltage of interest according to at least some of the sampled values for output voltage feedback for control of the switching inverter;
- wherein the at least one processor is programmed to average at least some of the sampled values corresponding to the phase voltage or line-line voltage of interest over a pulse width modulation period to compute the estimated volt-second value; and
- wherein the at least one processor is programmed to:
  - accumulate at least some of the sampled values corresponding to the phase voltage or line-line voltage of interest over the pulse width modulation period to provide an accumulation total value for the pulse width modulation period,
  - refrain from accumulating sampled values that fall within a predefined range that includes values representing positive and negative voltages, and
  - divide the accumulation total value by a number of samples for the pulse width modulation period to provide the estimated volt-second value for the phase voltage or line-line voltage of interest using the at least one processor.

5. The feedback system of claim 4, comprising:
- an analog subtractor circuit including at least one op amp receiving at least two buffered signals and providing a buffered line-line voltage signal;
- wherein the converter circuit is connected to sample the buffered line-line voltage signal from the analog subtractor circuit at the sampling frequency to provide the plurality of sampled values; and
- wherein the at least one processor is programmed to:
  - accumulate at least some of the sampled values over the pulse width modulation period to provide the accumulation total value for the pulse width modulation period, and
  - divide the accumulation total value by the number of samples for the pulse width modulation period to provide the estimated volt-second value.

6. The feedback system of claim 4:
- wherein the low pass filter circuit comprises a resistive divider network receiving the at least one output voltage signal from the switching inverter; and
- wherein the analog voltage follower circuit comprises an op amp with an input receiving a voltage divided signal from the resistive divider network and providing the buffered voltage signal;
- wherein the resistive divider network and an input capacitance of the op amp provide the RC low pass filter with the cutoff frequency below the output voltage waveform frequency.

7. The feedback system of claim 6, wherein the low pass filter circuit comprises an external capacitance connected between the input of the op amp and a circuit ground, and wherein the resistive divider network, the input capacitance of the op amp, and the external capacitance provide the RC low pass filter with the cutoff frequency below the output voltage waveform frequency.

8. The feedback system of claim 7, wherein the op amp has a bandwidth below the output voltage waveform frequency.

9. The feedback system of claim 6, wherein the op amp has a bandwidth below the output voltage waveform frequency.

10. The feedback system of claim 4, wherein the at least one processor is programmed to use the estimated volt-second value as an estimate of an actual PWM cycle-averaged voltage output of the inverter as feedback for closed loop control of the inverter.

* * * * *